United States Patent
Plesski (10) Patent No.: US 11,003,971 B2
(45) Date of Patent: May 11, 2021

(54) ULTRA-WIDE-BAND SAW SENSOR WITH HYPERBOLICALLY FREQUENCY-MODULATED ETCHED REFLECTOR

(71) Applicant: Resonant Inc., Goleta, CA (US)

(72) Inventor: Viktor Plesski, Gorgier (CH)

(73) Assignee: Resonant Inc., Austin, TX (US)

( * ) Notice: Subject to any disclaimer, the term of this patent is extended or adjusted under 35 U.S.C. 154(b) by 0 days.

(21) Appl. No.: 16/864,496

(22) Filed: May 1, 2020

(65) Prior Publication Data

US 2020/0257950 A1 Aug. 13, 2020

Related U.S. Application Data

(63) Continuation of application No. PCT/US2018/059463, filed on Nov. 6, 2018.

(60) Provisional application No. 62/582,515, filed on Nov. 7, 2017, provisional application No. 62/615,640, filed on Jan. 10, 2018.

(51) Int. Cl.
| | |
|---|---|
| *G06K 19/067* | (2006.01) |
| *H03H 9/02* | (2006.01) |
| *G06K 7/10* | (2006.01) |
| *G10K 11/28* | (2006.01) |

(52) U.S. Cl.
CPC ..... *G06K 19/0675* (2013.01); *G06K 7/10366* (2013.01); *G10K 11/28* (2013.01)

(58) Field of Classification Search
CPC ........... G06K 19/0675; H03H 9/02653; H03H 9/02811
USPC ........................................................ 235/451
See application file for complete search history.

(56) References Cited

U.S. PATENT DOCUMENTS

| | | |
|---|---|---|
| 7,915,785 B2 | 3/2011 | Andle et al. |
| 2005/0030129 A1* | 2/2005 | Yoneya .................... H03H 9/64 |
| 2006/0049714 A1 | 3/2006 | Liu et al. |

FOREIGN PATENT DOCUMENTS

EP 2 871 474 A1 5/2015

OTHER PUBLICATIONS

The International Bureau of WIPO, International Preliminary Report on Patentability for PCT Application No. PCT/US2018/059463, dated May 22, 2020.
Verma et al. "Surface Acoustic Wave Based Sensor", Mar. 7, 2013. https://www.slideshare.net/sjykmuch/surface-acoustic-wave-saw-based-sensors?from_action=save.

* cited by examiner

*Primary Examiner* — Toan C Ly
(74) *Attorney, Agent, or Firm* — SoCal IP Law Group LLP; John E. Gunther (57) ABSTRACT

There is disclosed a surface acoustic wave sensor. An interdigital transducer (IDT) and a first reflector are formed on a surface of a piezoelectric substrate. The first reflector is displaced from the IDT in a direction of acoustic wave propagation. The first reflector includes a plurality of elongate reflective elements including a first reflective element and N additional reflective elements, where N is a positive integer. A long axis of each of the reflective elements is perpendicular to the direction of acoustic wave propagation, and a distance between adjacent reflective elements along the direction of acoustic wave propagation is a linear function of distance from the first reflective element along the direction of acoustic wave propagation.

21 Claims, 10 Drawing Sheets

ULTRA-WIDE-BAND SAW SENSOR WITH HYPERBOLICALLY FREQUENCY-MODULATED ETCHED REFLECTOR

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent is a continuation of international patent application PCT/US18/59463, ULTRA-WIDE-BAND SAW SENSOR WITH HYPERBOLICALLY FREQUENCY-MODULATED ETCHED REFLECTOR, filed 6 Nov. 2018, which claims priority from provisional patent application 62/582,515, PASSIVE SAW SENSORS BASED ON HYPERBOLIC FREQUENCY MODULATION, filed Nov. 7, 2017, and provisional patent application 62/615,640, ULTRA-WIDE-BAND SAW SENSORS BASED ON HYPERBOLICALLY FREQUENCY MODULATED SIGNALS, filed Jan. 10, 2018, all of which are incorporated herein by reference.

BACKGROUND

Field

This disclosure relates to passive surface acoustic wave (SAW) sensors.

Description of the Related Art

SAW sensor tags operate on the basis of converting incoming electromagnetic energy into an acoustic propagating wave through piezoelectric effect. Since the velocity of the acoustic wave is dependent on the physical environment of the tag, SAW tags can be used as truly passive environmental sensors. Such tags can be remotely interrogated over relatively large distances using an interrogation reader operating through principles similar to RADAR. Such a reader emits a probe radio frequency (RF) signal that is received by the tag and converted into an acoustic wave. The acoustic wave is transformed and reflected within the tag and converted back into a return RF signal that is received by the reader. Many sensing applications require a single reader to probe multiple sensor tags and identify the responses received from each tag.

Throughout this description, elements appearing in figures are assigned three-digit reference designators, where the most significant digit is the figure number where the element is introduced, and the two least significant digits are specific to the element. An element that is not described in conjunction with a figure may be presumed to have the same characteristics and function as a previously-described element having the same reference designator.

DETAILED DESCRIPTION

Description of Apparatus

Figure 1:
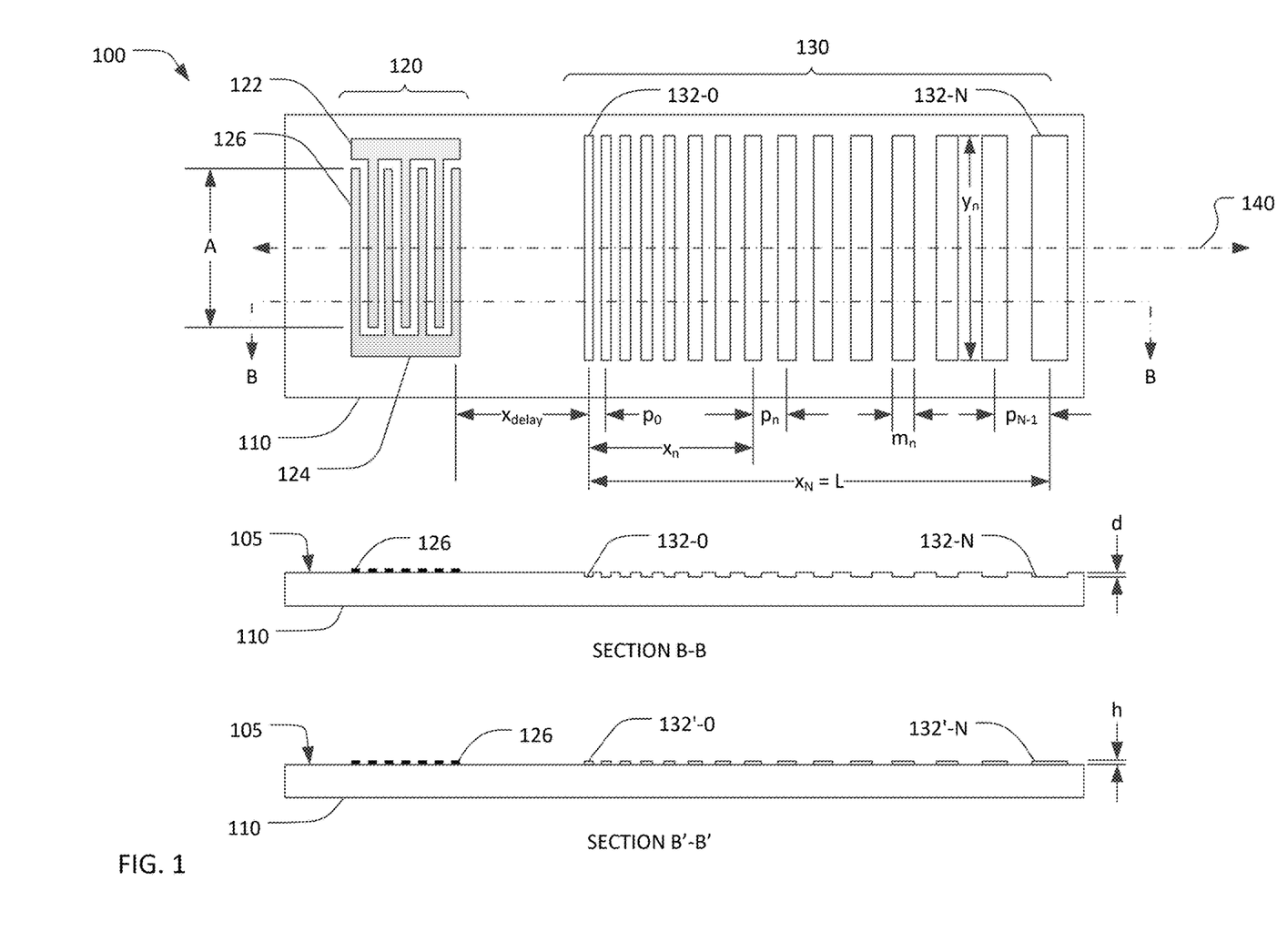
FIG. 1 includes a schematic top view and alternative cross-sectional views of a SAW sensor with a hyperbolically frequency-modulated reflector.

Referring now to FIG. 1, a SAW sensor tag 100 includes a substrate 110, an interdigital transducer (IDT) 120 formed on a surface 105 of the substrate 110, and a reflector 130 formed on the surface 105 of the substrate 110.

The substrate 110 is a single-crystal piezoelectric material. The substrate 110 is preferably a piezoelectric material with a strong piezoelectric coupling factor $K^2$, such as lithium niobate, lithium tantalate, or lanthanum gallium silicate. The substrate 110 may be a slab of the piezoelectric material or may be a thin wafer of the piezoelectric material bonded to a supporting slab (not shown in FIG. 1) of a different material, such as quartz or silicon.

The IDT 120 is a transducer for bidirectionally converting between a radio frequency signal and an acoustic wave using the piezoelectric effect. The IDT 120 includes two conductive busbars 122, 124 and a plurality of interdigitated elongate conductive fingers, such as finger 126, extending from the busbars. The IDT fingers, such as finger 126, and the IDT busbars 122, 124 are formed of a conductive material, such as aluminum or copper deposited onto the surface 105 of the substrate 100. Applying a radio frequency (RF) signal across the busbars 122, 124 of the IDT 120 launches an acoustic wave on the surface of the substrate 110.

For ease of illustration, the relative dimensions of IDTs shown the figures, including IDT 120 shown in FIG. 1, are substantially distorted. The pitch, or center-to-center distance of the interdigitated conductive fingers, such as finger 126, is determined by the center frequency of the RF signal to be applied to the IDT and the velocity of the acoustic waves generated by the IDT. For use at microwave frequencies, the pitch of the ID is typically less than 2 microns. The width of the conductive fingers is typically 40% to 60% of the pitch. The length of the overlapping portions of the interdigitated fingers (dimension A in FIG. 1) is commonly called the "aperture" of the IDT. The aperture of an IDT may be 20 to 100 times the pitch of the interdigitated fingers.

An IDT is typically designed for operation over a particular band of RF frequencies. The center-to-center distance or pitch of the interdigitated fingers is typically ½ of the acoustic wavelength at the center frequency of the frequency band. The relative RF bandwidth of the IDT is approximately two divided by the total number of IDT fingers. An IDT for broad-band operation may typically have 5 to about 15 fingers. The IDTs illustrated in the figures, including the IDT 120 of FIG. 1, include seven fingers and will have bandwidths of about 2/7 or 28%.

Applying a radio frequency signal across the busbars 122, 124 causes the IDT 120 to launch an acoustic wave that propagates across the surface 105 of the substrate 110. The acoustic wave launched by the IDT 120 is transformed and reflected by the reflector 130. The reflected acoustic wave is converted back into a transformed RF signal by the IDT 120. The transformed RF signal is returned to a reader (not shown). Knowing how the SAW sensor tag 100 transforms the RF signal allows the reader to compress the returned signal using matched-to-signal filtering. A returned signal of duration T can be compressed into a short pulse of duration 1/B, where B is the bandwidth of the interrogation signal, providing a processing gain of about B·T.

The direction of propagation of the acoustic waves (the acoustic wave launched by the IDT 120 and the acoustic wave reflected by the chirped reflector 130) is normal to the fingers of the IDT 120 as indicated by the arrow 140. Typically, the IDT is disposed on the substrate such that the direction of propagation 140 is parallel to a crystal axis of the substrate 110. For example, the substrate may be 128-degree Y-cut $LiNbO_3$ with the direction of propagation 140 parallel to the X axis. For further example, the substrate may be YZ-cut $LiNbO_3$ with the direction of propagation 140 parallel to the Z axis.

The reflector 130 is composed of N+1 reflective elements, where N is an integer greater than 1. The reflective elements are numbered from element 0 (reference designator 132-0) to element N (reference designator 132-N). For ease of illustration, the reflectors shown in the figures, including the reflector 130 of FIG. 1, are shown with a total of 15 reflective elements. The reflector of an actual SAW sensor tag may have hundreds or thousands of reflective elements distributed over a total reflector length L. The length of the reflector is determined by the desired duration T of the reflected signal in accordance with the formula $$L=V \cdot (T/2),$$ [001]

where V is the propagation velocity of the surface acoustic wave. Propagation velocity may be slightly influenced by the presence of the reflective elements and may be slightly dependent on RF frequency. In this case, V in equation 001 may be an average propagation velocity over the RF frequency range. Alternatively, a more exact model of the SAW sensor may be used to determine L.

Each reflective element is an elongate structure arranged with its long axis normal to the direction of propagation 140 (and thus parallel to the IDT fingers). The first reflective element 132-0 is offset (along the direction of propagation) from the IDT by a distance $x_{delay}$. The purpose of this offset is to establish a time delay (determined by the distance $x_{delay}$ and the propagation velocity V of the acoustic wave) between the launching of an acoustic wave at the IDT and the start of the transformed acoustic wave reflected from the reflector.

Figure 2:
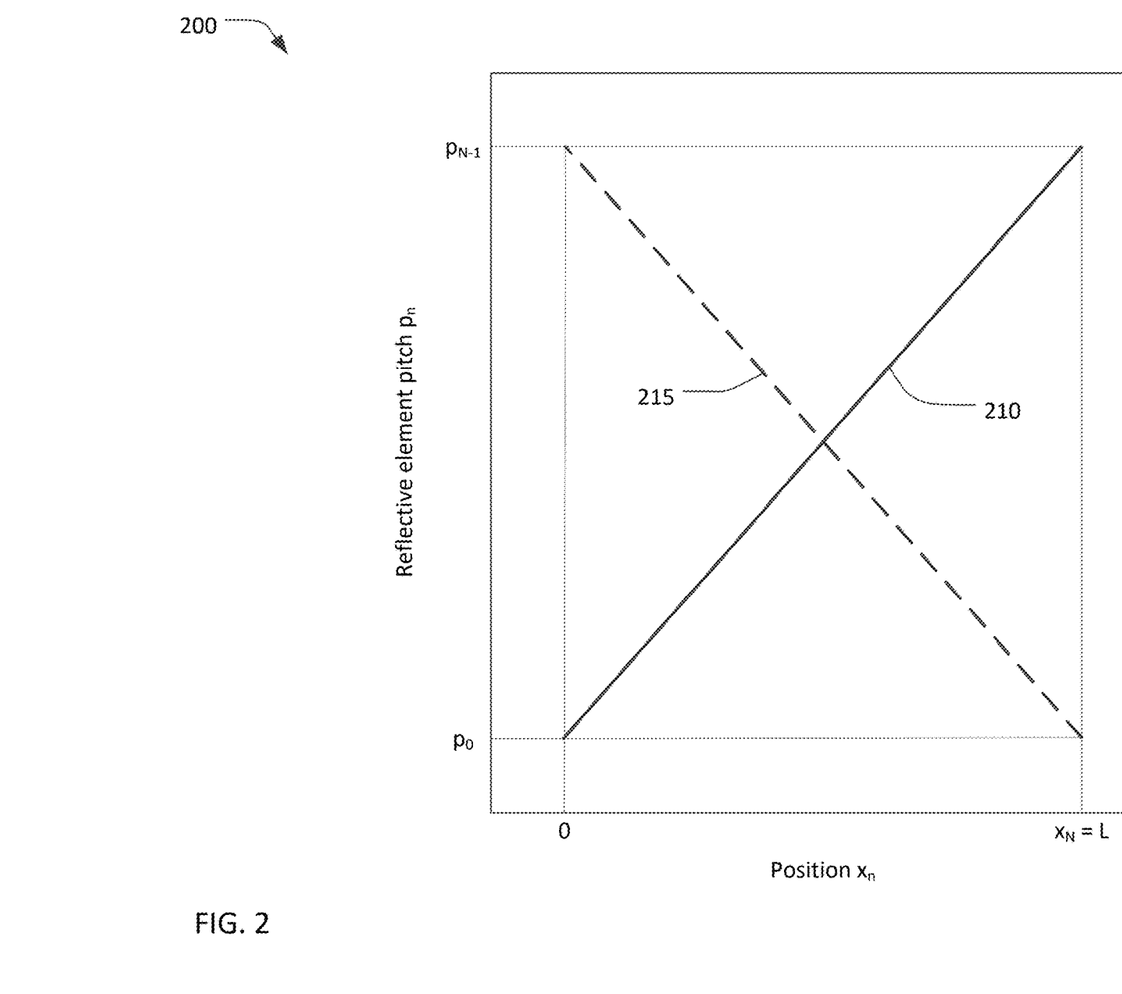
FIG. 2 is a chart showing the pitch between adjacent reflective elements as a function of distance.

The center-to-center distance between the first reflective element 132-0 and each other reflective element is $x_n$, where n is the number of the other reflective element (n=1, 2, . . . N). The center-to-center distance from each reflective element and the subsequent reflective element is a pitch $p_n = x_{n+1} - x_n$. Importantly, the pitch $p_n$ between adjacent reflective element is not constant but is rather a linear function of the position of the reflective elements, according to the following equation:

$$p_n = p_0 + \varepsilon \cdot x_n.$$ [002]

where p0 and ε are parameters that define the chirped reflector. The parameter ε may be positive or negative. When ε is positive, the pitch of the reflective elements increases with distance from the IDT (as shown in FIG. 1). When ε is negative, the pitch of the reflective elements decreases with distance from the IDT. FIG. 2 is a graph of pitch $p_n$ as a function of position of $x_n$. The solid line 210 is a plot of equation 002 with positive E and the dashed line 215 is a plot of equation 002 with negative ε.

An important feature of the reflector geometry defined by equation 002 is that the transformation of the acoustic wave that occurs during reflection is independent of temperature. Changing the temperature of a SAW sensor tag will change (via thermal expansion/contraction) the position and pitch of each reflective element proportionally, such that equation 002 is valid at any temperature with a corresponding change in $p_0$. Basically, a change in SAW sensor tag temperature will cause the lines 210 and 215 in FIG. 2 to move along themselves, without changing slope.

The SAW tag 100 may designed for operation over a frequency range from a minimum frequency $F_{min}$ to a maximum frequency $F_{max}$, where $F_{max} - F_{min}$=bandwidth B. The for the pitch of the reflective elements can then be determined by the equations $$p_0 = V/(2F_{max}),$$ [003]

$$p_{N-1} = V/(2F_{min}), \text{ and}$$ [004]

$$\varepsilon = (p_{N-1}/p_0)^{(1/N)} - 1$$ [005]

Equations 003-005 result in a reflector where the pitch of the reflective elements increases with distance from the IDT and ε is positive. Interchanging $F_{max}$ and $F_{min}$ in equations 003 and 004 results in a reflector where the pitch of the reflective elements decreases with distance from the IDT and ε is negative.

Each reflective element 132-0 to 132-N has a length $y_n$ normal to the direction of propagation 140 of and a width along the direction of propagation of $m_n$ (n=0, 1, 2, . . . N). For ease of illustration, $y_n$ is constant in the SAW sensor tag 100 depicted in FIG. 1, which is to say all of the reflective elements 132-0 to 132-N shown in FIG. 1 have the same length. The width of each reflective element $m_n$ may be a function of position $x_n$, such that the ratio $m_n/p_n$ is constant or nearly constant. Ideally, the ratio $m_n/p_n$ may be 0.5.

SAW devices for other applications, such as RF filters, commonly include reflectors formed from parallel metallic reflective elements similar to the fingers of the IDT 120. However, individual metallic fingers are highly reflective, independent of their thickness. On a substrate with strong piezoelectric coupling, only a few metallic fingers are needed to completely reflect an acoustic wave. In a SAW sensor tag, it is necessary to distribute the reflection (for a given frequency f) over a "synchronous region", where the pitch of the reflective elements corresponds to frequency f and the neighboring reflective elements contribute in phase to the total reflectivity. The number of reflective elements in such a region can be estimated as N/sqrt(BT), which may be 100 fingers in a typical SAW sensor tag. To ensure that the acoustic wave reflects from all of the reflective elements within the synchronous region, a SAW sensor tag requires reflective elements that each reflect less than 1% of the incident acoustic wave. Thus metallic reflective elements, which have substantially higher reflectivity per finger, are unsuitable for SAW sensor tags. Another reason metallic fingers cannot be used in reflectors for SAW sensor tags is the high viscous and resistive attenuation that occurs in metal reflectors.

Referring now to cross-sectional view B-B in FIG. 1, the reflective elements 132-0 to 132-N of the reflector 130 may be shallow grooves etched in the surface 105 of the substrate 110. These grooves may be formed, for example, by applying and patterning a photoresist layer and then etching the grooves using a wet or dry etching process suitable for the material of substrate 110. The groove depth d may be, for example, 5 nm to 40 nm. Note that the groove depth is greatly exaggerated in FIG. 1 for ease of depiction. For ease of illustration, the grooves shown in Section B-B have rectangular cross-sections. In actual devices, the groove cross-section may be rectangular, triangular, trapezoidal, or some other shape depending upon the process used to etch the grooves.

Alternatively, referring now to alternative cross-sectional view B'-B', the reflective elements 132'-0 to 132'-N of the reflector 130 may be shallow ridges extending from the surface 105 of the substrate 110. These ridges may be formed, for example, by depositing a thin layer of a material, such as $SiO_2$ or $Si_3N_4$, over the surface 105 of the substrate 110; applying and patterning a mask layer; and then etching away the deposited material other than the ridge locations using a wet or dry etching process suitable for the deposited material. The ridge height h may be, for example, 5 nm to 40 nm. Note that the ridge height is greatly exaggerated in FIG. 1 for ease of depiction. For ease of illustration, the ridges shown in Section B'-B' have rectangular cross-sections. In actual devices, the ridge cross-section may be rectangular, triangular, trapezoidal, or some other shape depending upon the process used to etch the grooves.

In the SAW sensor tag 100 (where the reflective element length $y_n$ and depth d or height h are constant), the reflectively of adjacent reflective elements will be approximately the same. For a given frequency f, each reflective element within the synchronous region for that frequency will reflect a small fraction of the energy of an incident acoustic wave and correspondingly attenuate the remining portion of the acoustic wave that continues propagating in its original direction. The cumulative reflections from multiple reflective elements within the synchronous region may provide a total reflection coefficient of 0.2 to 0.8. However the propagating acoustic wave may be substantially attenuated by acoustic absorption in the substrate material, diffraction, scattering from reflective elements, and other mechanisms. In addition, the reflectivity of a reflective element will be will be proportional to relative depth $d_n/p_n$ or relative height $h_n/p_n$. For the SAW sensor tag of FIG. 1, where the depth $d_n$ or height $h_n$ of the reflective elements is constant, the reflectivity per reflective element will gradually decrease with distance from the IDT. Consequently, the amplitude of the reflections from the downstream elements of the reflector 130 (the right side of the reflector as shown in FIG. 1) may be substantially smaller than the reflections from the upstream side of the reflector 130 (the left side of the reflector as shown in FIG. 1). Widely varying reflectivity along the length of the reflector 130 makes the weight of various frequency components of a broadband RF signal not equivalent. This, in turn, may degrade the compression gain possible by processing the reflected signal.

Figure 3:
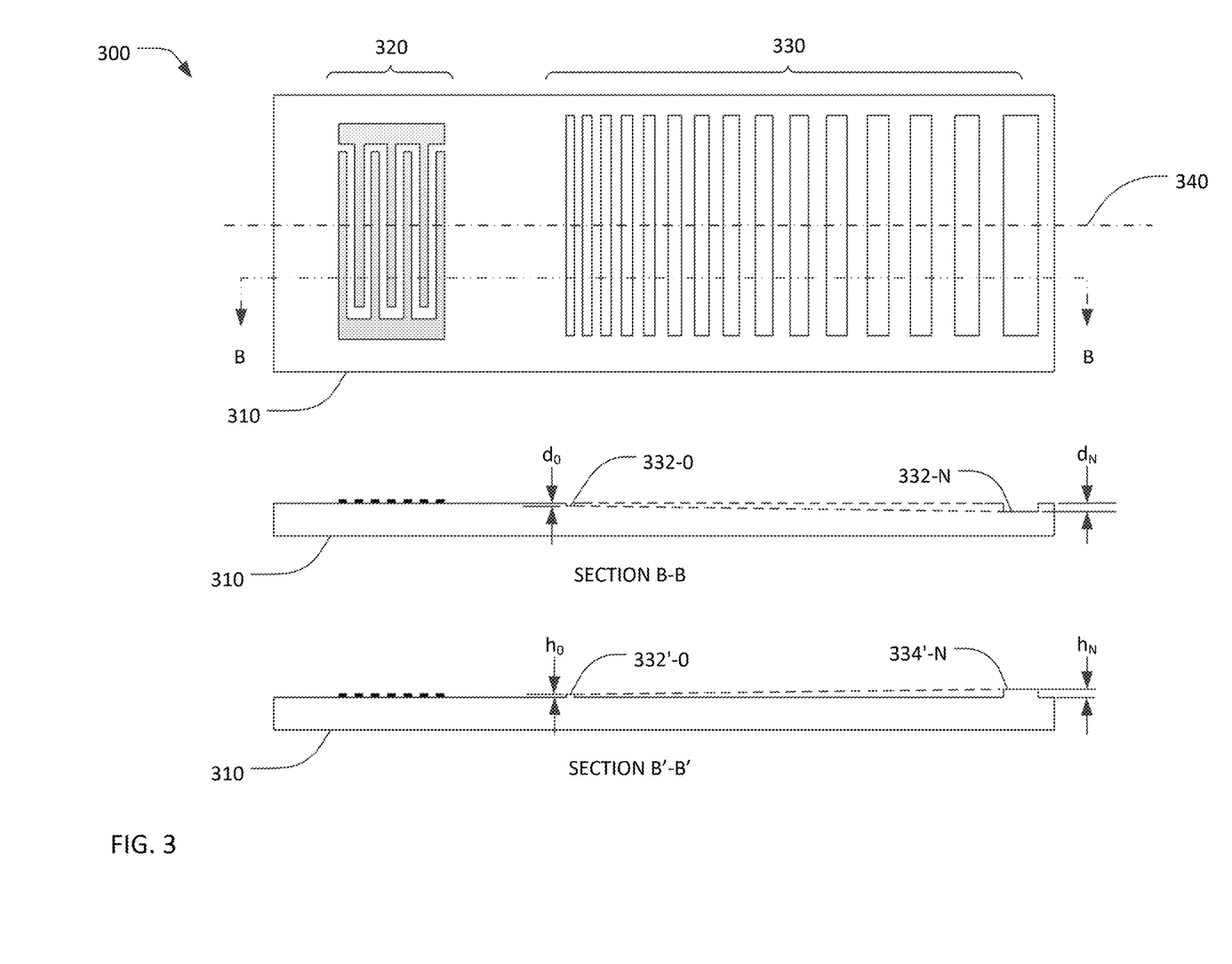
FIG. 3 includes a schematic top view and alternative cross-sectional views of another SAW sensor with a hyperbolically frequency-modulated etched reflector.

The reflections from the upstream and downstream sides of the reflector in a SAW sensor tag may be equalized, at least in part, by profile weighting, which is to say by varying the cross-sectional profile of the reflective elements. FIG. 3 shows a SAW sensor tag 300 including a substrate 310, and IDT 320, and a profile-weighted reflector 330. The SAW sensor tag 300 is similar to the SAW sensor tag 100 of FIG. 1 except that the cross-sectional profiles of the reflective elements of the reflector 300 vary along the direction of propagation 340. The variation in cross-sectional profile may equalize the reflectivity of the reflective elements and/or compensate, at least in part, for the attenuation that occurs during propagation of the acoustic wave.

As shown in the cross-section view B-B, the depth of reflective element grooves may be increased as a function of distance from the IDT such that $d_N>d_0$. As shown in the alternative cross-section view B'-B', the height of reflective element ridges may be increased as a function of distance from the IDT such that $h_N>h_0$. The change in groove depth or ridge height may be a linear function of distance (as implied in FIG. 3), a nonlinear function of distance, or a series of steps. For example, the groove depth or ridge height may be a linear function of distance such that the ratio $d_n/p_n$ or $h_n/p_n$ is constant. The groove depth or ridge height may be a linear function of distance such that the ratio $d_n/p_n$ or $h_n/p_n$ increase with distance from the IDT to compensate, at least in part, for the attenuation that occurs during propagation of the acoustic wave. As illustrated in FIG. 3, the change in groove depth or ridge height is 2:1 ($d_N=2d_0$, $h_N=2h_0$). In practice, the relative range of groove depth or ridge height may be greater than or less than 2:1.

Figure 4:
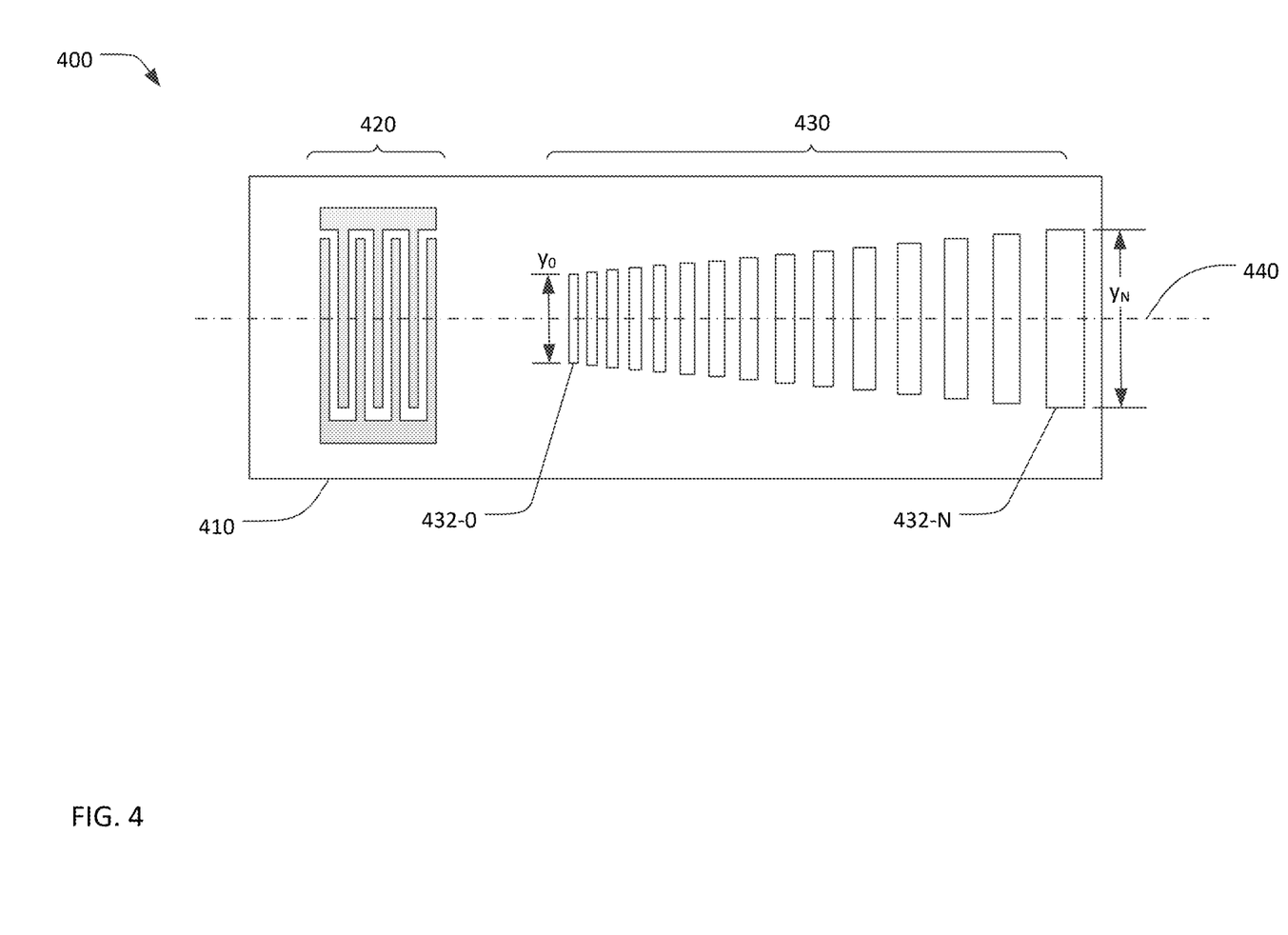
FIG. 4 is a schematic top view of another SAW sensor with an aperture-weighted hyperbolically frequency-modulated etched reflector.

Another technique to equalize, at least in part, reflections from the upstream and downstream sides of the reflector in a SAW sensor tag is aperture weighting, which is to say to vary the aperture (i.e. the width normal to the direction of propagation) of the reflective elements as a function of distance from the IDT. FIG. 4 is a plan view of a SAW sensor tag 400 including a substrate 410, an IDT 420 and an aperture-weighted reflector 430. In the reflector 430, the length $y_n$ of the reflective elements is varied over a 2:1 range ($y_N=2y_0$) as a linear function of distance from the IDT. The change in reflective element length may be a linear function of distance (as shown in FIG. 4), a nonlinear function of distance, or a series of steps. In practice, the relative range of reflective element length may be greater than or less than 2:1. Aperture weighting may be used with reflective elements having uniform cross-section, as shown in the cross-sectional views of FIG. 1, or in combination with profile-weighted reflective elements as shown in the cross-sectional views of FIG. 3.

As previously described, the first reflective element 132-0, 332-0, or 432-0 is offset (along the direction of propagation) from the IDT by a distance $x_{delay}$. This offset results in a time delay $T_{delay}=2 \cdot x_{delay}/V$, between the launching of an acoustic wave at the IDT and the receipt at the IDT of the leading edge of the transformed acoustic wave reflected from the reflector. $T_{delay}$ is cumulative with the (presumably unknown) round-trip propagation delay between the SAW sensor tag and a reader interrogating the tag, and thus is not useful, of itself, to measure precisely any physical parameter of the environment around the SAW sensor tag.

Figure 5:
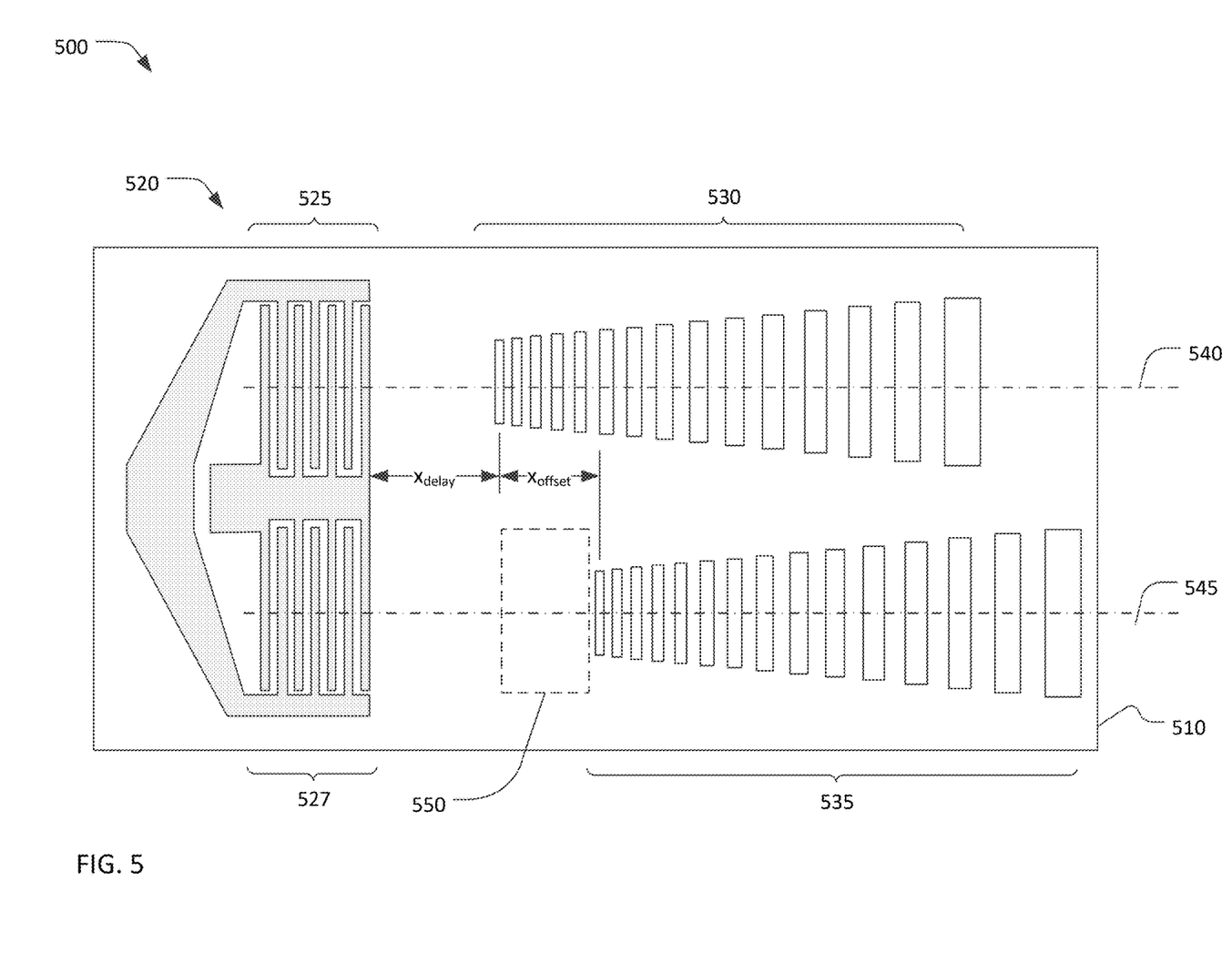
FIG. 5 is a schematic top view of a dual-track SAW sensor with offset reflectors.

FIG. 5 is a schematic plan view of a SAW sensor tag 500 including a substrate 510, an interdigital transducer (IDT) 520 formed on a surface of the substrate 510, and two reflectors 530, 535 formed on the surface of the substrate 510. The IDT 520 is divided into two sections 525, 527 that are electrically connected in parallel. Applying an RF signal to the IDT 520 causes the IDT sections to launch two identical acoustic waves that propagate along parallel axes 540, 545.

The two reflectors 530, 535 shown in FIG. 5 are aperture-weighted. These reflectors may be unweighted, aperture weighted, profile weighted, or both aperture and profile weighted. The first reflector 530 is disposed to transform and reflect the acoustic wave launched by the first IDT section 525. The second reflector 535 is disposed to transform and reflect the acoustic wave launched by the second IDT section 527. The reflections from both reflectors are received at the respective IDT sections and converted to a combined transformed RF signal.

The first reflector 530 and the second reflector 535 are offset along the direction of propagation by a distance $x_{offset}$. Optionally, an area 550 defined by the aperture of the IDT 527 and the distance $x_{offset}$ may be coated with a sensitive material, which will be described subsequently. The first reflector 530 and the second reflector 535 may be similar or the second reflector 535 may have higher reflectivity to offset the higher propagation losses incurred due to the longer path traveled by the acoustic wave that reflects from the second reflector. In either case, the transformed acoustic waves reflected from the two reflectors will return to the IDT separated by a time difference $T_{offset}$. As will be described subsequently, $T_{offset}$ can be accurately determined by a reader interrogating the SAW sensor tag 500, independent of the initial delay (caused by the distance $x_{delay}$) or the propagation delay between the reader and the SAW sensor tag 500.

In the absence of a sensitive material in the area 550, $T_{offset} \approx 2 \cdot x_{offset}/V$. In this case, $T_{offset}$ depends only on the physical characteristics $x_{offset}$ and $V$ which vary with the temperature of the SAW sensor tag. The value of $T_{offset}$ determined by the reader can be mapped to the temperature of the SAW sensor tag, providing a passive remotely-interrogated temperature sensor.

When a sensitive material is present in the area 550, $T_{offset} \approx 2 \cdot x_{offset}/V_{offset}$, where $V_{offset}$ is the propagation velocity of surface acoustic waves in the area 550, which is influenced by the presence of the sensitive material. The sensitive material in the area 550 may be a material that causes a change in $V_{offset}$ in response to some condition in the environment surrounding the SAW sensor tag 500. For example, the area 550 may be coated with a layer of Palladium, which is sensitive to hydrogen, providing a passive remotely-interrogated hydrogen sensor.

Figure 6:
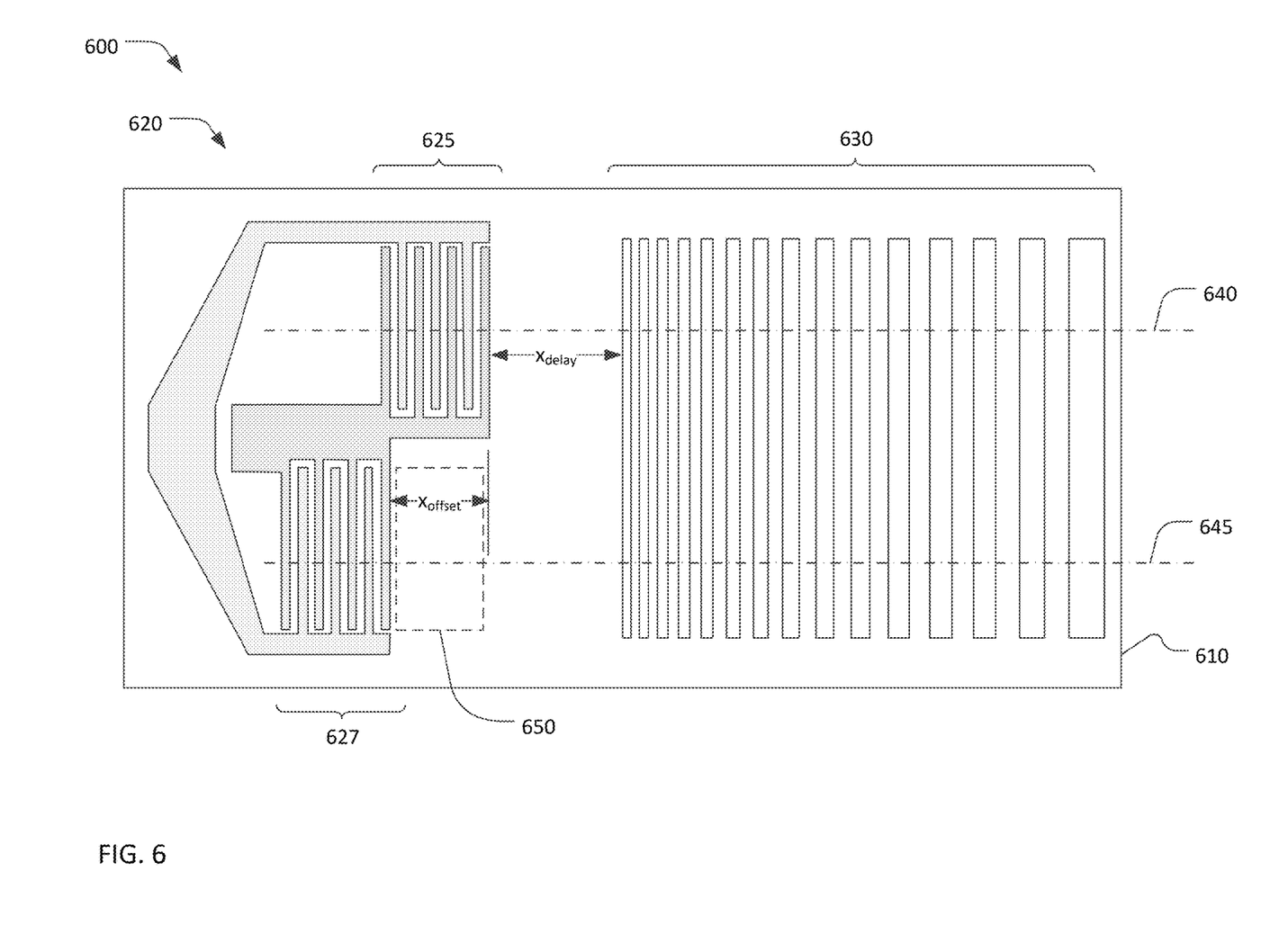
FIG. 6 is a schematic top view of another dual-track SAW sensor with offset IDTs.

FIG. 6 is a schematic plan view of a SAW sensor tag 600 including a substrate 610, an interdigital transducer (IDT) 620 formed on a surface of the substrate 610, and a reflector 630 formed on the surface of the substrate 610. The IDT 620 is divided into two sections 625, 627 that are electrically connected in parallel and offset along the direction of propagation by a distance $x_{offset}$. Optionally, an area 650 defined by the aperture of the IDT 627 and the distance $x_{offset}$ may be coated with a sensitive material, as previously described. Applying an RF signal to the IDT 620 causes the IDT sections to launch acoustic waves that propagate along parallel axes 640, 645.

The reflector 630 is disposed to transform and reflect the acoustic waves launched by the IDT sections 625, 627. The transformed reflected acoustic waves are received at the respective IDT sections and converted to a combined transformed RF signal.

Because of the offset between the first and section sections 625, 627 of the IDT 620, there is a time difference $T_{offset} = 2 \cdot x_{offset}/V$ (in the absence of a sensitive material in the area 650) between the reflections received by the first IDT section 625 and the reflections received by the second IDT section 627. Thus, the SAW sensor tag 600 is functionally equivalent to the SAW sensor tag 500 of FIG. 5. If profile weighting is used to balance the reflectivity along the length of the reflector(s), the configuration of the SAW sensor tag 600 may be preferable to the configuration of the SAW sensor tag 500 because the profile weighting is automatically the same along both of the axes 640, 645.

The function of the SAW sensor tags 500, 600 can be provided by two physically separate SAW sensor tags if the distance from the IDTs to the reflectors in the tags differs by $x_{offset}$.

Interrogating a SAW sensor tag involves applying a probe RF signal to the IDT within the tag. The IDT converts the probe signal into an acoustic wave that is transformed and reflected within the tag. The IDT converts the reflected transform acoustic wave into a return RF signal. The return RF signal is processed to determine $T_{offset}$. $T_{offset}$ is then mapped to temperature or some other physical property of the SAW sensor tag or its environment. A variety of different probe signal and processing techniques may be used.

Figure 7A:
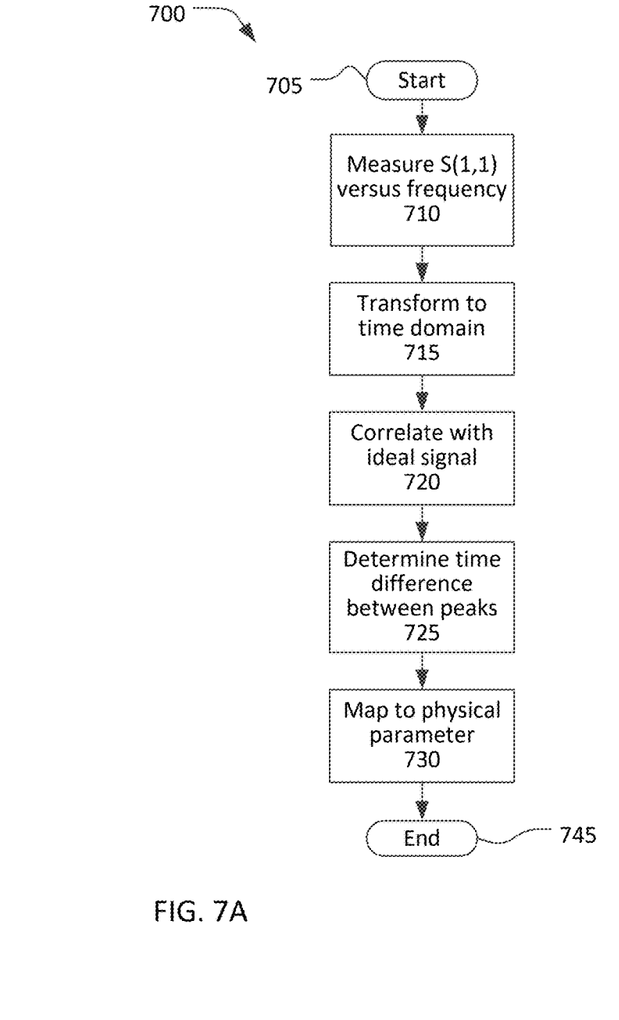
FIG. 7A is a flow chart of a process for interrogating a SAW sensor.

FIG. 7A is a flow chart of a method 700, adapted from continuous wave (CW) radar systems, to interrogate a SAW sensor tag, such as the SAW sensor tags 500 and 600, to determine a physical parameter, such as the temperature of the SAW sensor tag. The process begins at 705 and ends at 745. The process is not inherently cyclic but may be repeated periodically or intermittently.

At 710, S11(f) (i.e. the reflectivity of the tag as a function of frequency) of the SAW sensor tag is measured. For example, the frequency of an RF signal applied to the SAW sensor tag may be swept in steps from a minimum frequency to a maximum frequency. Each frequency step may be held for a sufficient period of time to permit measurement of the magnitude and phase (or real and imaginary components) of the transformed signal reflected from the SAW sensor tag. The measurements at 710 may be performed for a large number of closely-spaced frequency steps.

At 715, the frequency-domain measurements from 710 are transformed into a time domain signal using a Fourier transform or other mathematical technique. The visible delay is inversely proportional to the frequency step and the resolution of the signal in the time domain will depend on the used frequency band.

At 720, the time domain signal from 715 is correlated with a hypothetical ideal signal. The ideal signal may be a representation of a lossless noise-free signal reflected from an ideal chirped reflector of the type incorporated in the SAW sensor tag being interrogated. The results of the correlation will be a signal with two correlation peaks corresponding to the two transform acoustic waves reflected within the SAW sensor tag. The time difference between the two peaks, $T_{offset}$, is determined by the distance $x_{offset}$ within the SAW sensor tag, which (without the presence of a sensitive material in the SAW sensor tag) is dependent on the temperature of the SAW sensor tag.

A unique benefit of a hyperbolically frequency-modulated reflector is that an expansion or compression of the reflector is physically equivalent to a shift of the reflector along the propagation direction. Thus, even if the reflectors are expanded or compressed a little due to an unknown temperature shift or other factors (e.g. errors in manufacturing, influence of grooves on the wave velocity, etc.), the compression of the signal by correlation with an ideal reference signal will always be the same.

At 725, the two correlation peaks are identified and the time difference between the two correlation peaks is determined. The peaks may be identified, for example, by a second correlation operation that correlates the results from 720 between themselves thus finding the delay between the peaks. At 730, the time difference determined at 725 is mapped to a physical parameter of the SAW sensor tag and/or its environment. For example, the expected value of $T_{offset}$ may be known at a particular temperature (typically 25° C.) and the deviation from the expected value can be mapped to a deviation from the particular temperature. The process then ends at 745.

Figure 7B:
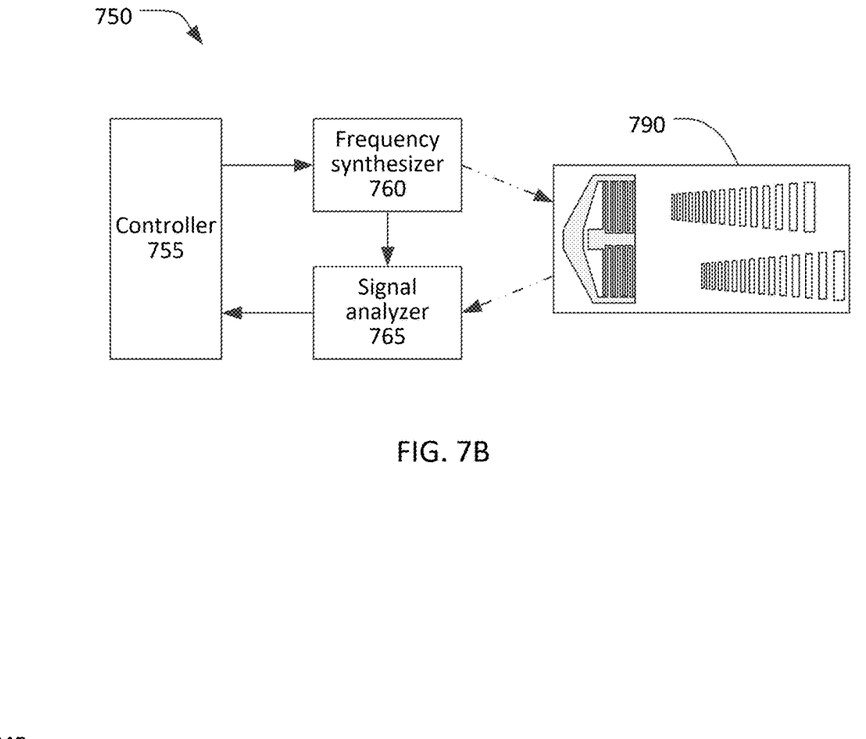
FIG. 7B is a block diagram of a reader for interrogating a SAW sensor.

FIG. 7B is a block diagram of a reader 750 for interrogating a SAW sensor tag 790, which may be the SAW sensor tag 500 or 600. The reader 750 includes a frequency synthesizer 760, a signal analyzer 765, and a controller 755. In a laboratory environment, the reader 750 may be embodied in a commercial network analyzer. In a field application, the reader 750 may be embodied in purpose-build hardware.

The controller 755 may include one or more processors such as a microprocessor, a graphics processing unit, and/or a digital signal processor. The controller 755 may include volatile and nonvolatile memory and may store software instructions to cause the controller to execute the process 705 of FIG. 7A. The controller 755 may have an interface to a network. The controller 755 may have a user interface that may include a display and one or more user input devices. The controller may communicate with the frequency synthesizer 760 and the signal analyzer 765 by means of, for example, a network or dedicated connections.

In a laboratory environment, the frequency synthesizer 760 and the signal analyzer 765 may be coupled to the SAW sensor tag 790 by means of one or more cables. In actual use, the frequency synthesizer 760 and the signal analyzer 765 may be coupled to the SAW sensor tag 970 wirelessly via respective antennas (not shown).

The controller 755 may control the frequency synthesizer 760 and the signal analyzer 765 to perform step 710 of the process 700. Specifically, the controller 755 may instruct the frequency synthesize 760 to generate an RF signal that steps from a minimum frequency to a maximum frequency. At each frequency step, the controller 755 may receive and store an S11 measurement provided by the signal analyzer 765.

After S11(f) has been measured and stored for the entire frequency range from the minimum frequency to the maximum frequency, the controller 755 may perform the steps 715-730 of the process 700. Specifically, the controller may perform operations to transform the frequency-domain S11 (f) measurements into a time domain signal S11(t) using a Fourier transform or other mathematical technique. The controller may perform operations to correlate the transformed time-domain signal with a hypothetical ideal signal with hyperbolic frequency modulation. The controller 755 may then identify correlation peaks, determine the time difference between the correlation peaks, and map the time difference to a temperature or other physical parameter of the SAW sensor tag and/or the environment.

FIGS. 9A, 9B, 10A, and 10B show measured results from applying the interrogation process 700 to a representative SAW sensor tag with the following characteristics:
No. of IDT fingers=9
$F_{min}$=2000 MHz
$F_{max}$=2500 MHz
B=500 MHz
Substrate=YZ-cut Lithium Niobate
V=3488 m/second
L=1744 um
T=1 uS
$p_0$=697.6 nm
$p_N$=872 nm
N=2231
$T_{offset}$=0.5 uS (at nominal temperature)

Figure 8:
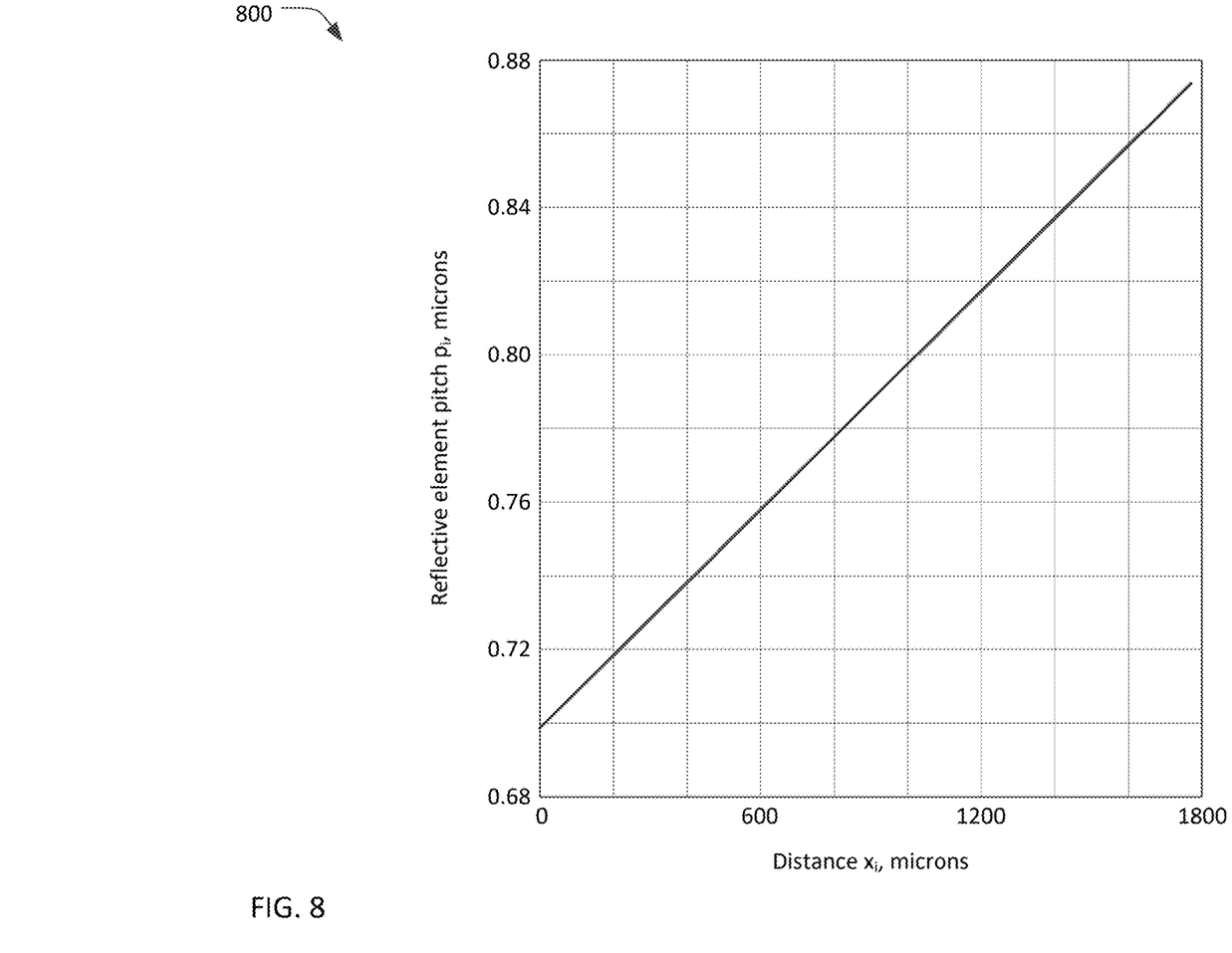
FIG. 8 is a chart showing the pitch between adjacent reflective elements as a function of distance for an exemplary SAW sensor tag.

The general configuration of the measured SAW sensor tag was comparable to the SAW sensor tag 500 (except for the number of IDT fingers and reflective elements) including aperture weighting. The linear relationship between reflective element pitch and relative position on the substrate is shown in the graph 800 of FIG. 8.

Figure 9A:
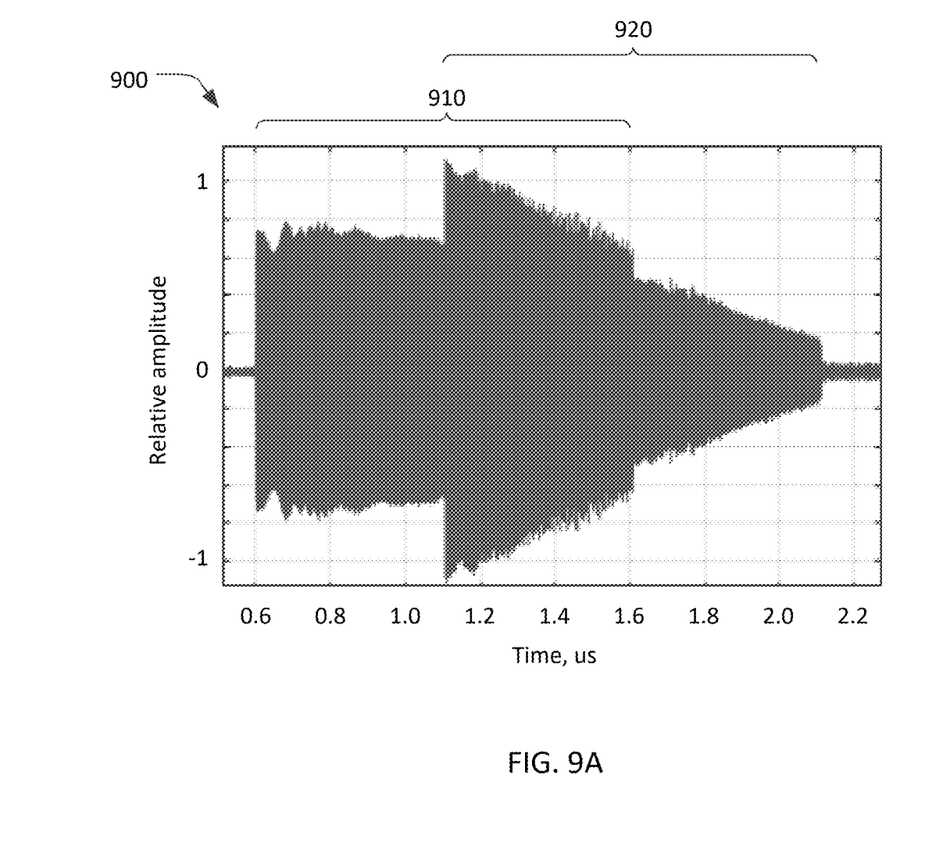
FIG. 9A is a chart of the amplitude of the signal reflected from the SAW sensor tag after transformation to the time domain.
Figure 9B:
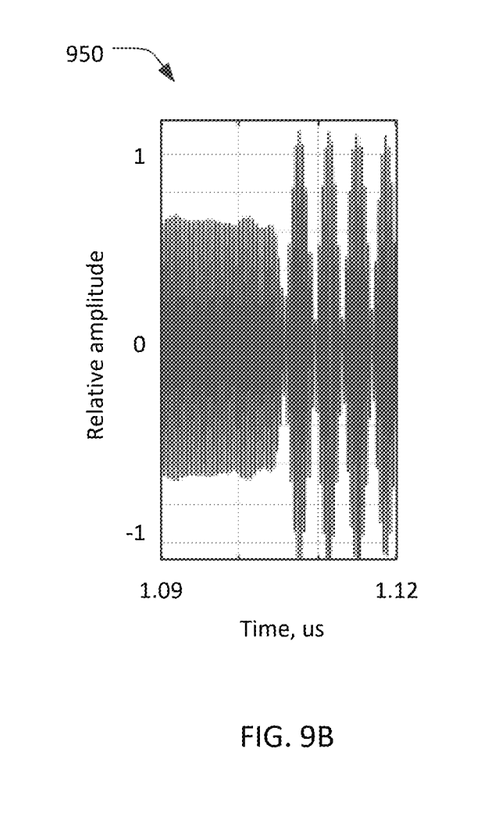
FIG. 9B is a portion of the chart of FIG. 9A expanded along the time axis.

FIG. 9A is a graph 900 of the measured time-domain signal at the conclusion of step 715 of the process 700, which is to say after transformation of the frequency-domain S11 measurements into the time domain. The signal 910 reflected from the first reflector of the SAW sensor tag is present from 0.6 uS to 1.6 uS. The signal 920 reflected from the second reflector of the SAW sensor tag appears from 1.1 uS to 2.1 uS. FIG. 9B is a time-expanded portion of FIG. 9A. The large amplitude variations after 1.1 uS are caused by the frequency beat between the signals due to the acoustic waves reflected from the first and second reflectors, which arrive at the SAW sensor tag simultaneously but have different frequencies.

Figure 10A:
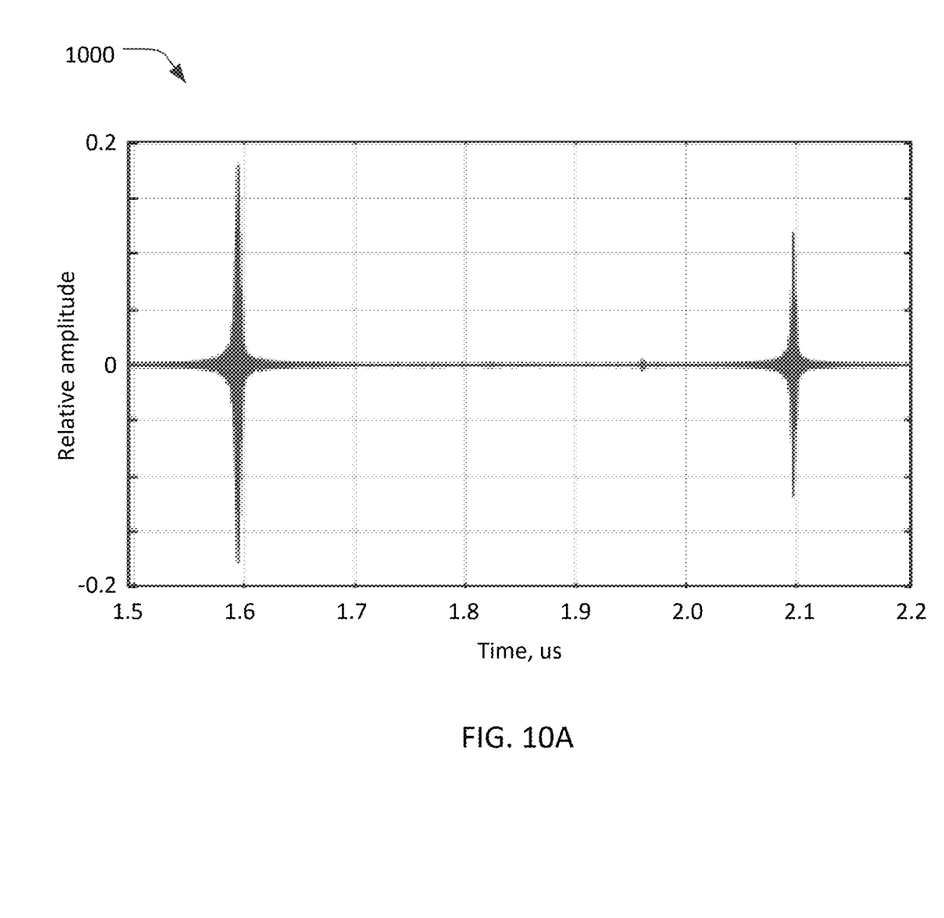
FIG. 10A is a chart of the result of correlating the signal of FIG. 9A with a reference signal.
Figure 10B:
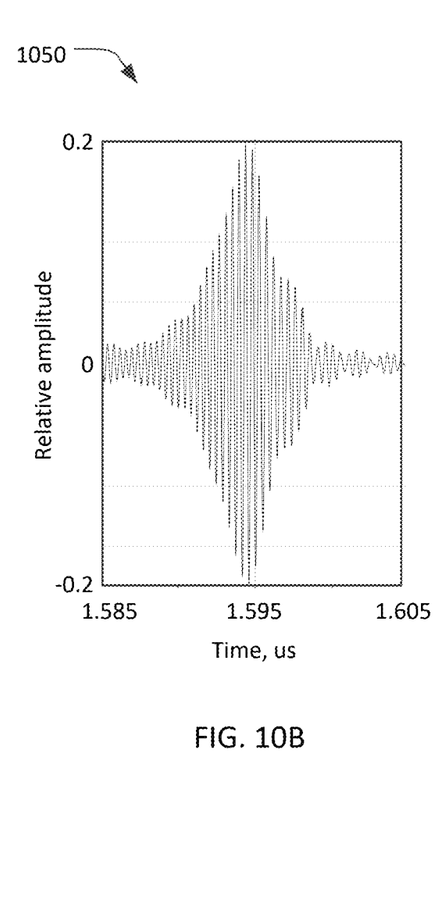
FIG. 10B is a portion of the chart of FIG. 9A expanded along the time axis.

FIG. 10A is a graph 900 of the time-domain signal at the conclusion of step 720 of the process 700, which is to say after correlation of the time domain signal shown in FIG. 9A with an ideal reflected signal. Two correlation peaks separated by about 0.5 uS are apparent as expected. FIG. 10B is a time-expanded portion of FIG. 10A showing one of the correlation peaks. The peak width at −3 dB level is close to expected 1/B=2 ns. The delay between the peaks can be determined by the second correlation operation (at 725 in FIG. 7A), simplified by the fact that the peaks have the same shape and their overlapping is unique, without 2pi ambiguity. The precision of the delay determination is determined by the phase noise (which in its turn is a function of signal-to-noise ratio) and can be of the order of 1 picosecond for strong signals.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A surface acoustic wave sensor, comprising:
   a piezoelectric substrate;
   an interdigital transducer (IDT) formed on a surface of the substrate; and
   a first reflector formed on the surface of the substrate, the first reflector displaced from the IDT in a direction of acoustic wave propagation, wherein
   the first reflector comprises a plurality of elongate reflective elements including a first reflective element and N additional reflective elements, where N is a positive integer,
   a long axis of each of the reflective elements is perpendicular to the direction of acoustic wave propagation, and
   a distance between adjacent reflective elements along the direction of acoustic wave propagation is a linear function of distance from the first reflective element along the direction of acoustic wave propagation.

2. The surface acoustic wave sensor of claim 1, wherein the first reflector is subject to the equation:

$p_n = p_0 + \varepsilon \cdot x_n$, and wherein:
   $x_n$ is a distance along the direction of acoustic wave propagation from the first reflective element to the n'th reflective element, where n is an integer between 1 and N,
   $p_n = x_{n+1} - x_n$ is the distance along the direction of acoustic wave propagation between adjacent reflector elements n and n+1; and
   $p_0$ and $\varepsilon$ are parameters that define the first reflector.

3. The surface acoustic wave sensor of claim 2, wherein
   $p_0$ is determined based on one of a minimum frequency $F_{min}$ and a maximum frequency $F_{max}$ of a radio frequency signal to be applied to the IDT,
   $p_{N-1}$ is determined based on the other of the minimum frequency and the maximum frequency, and $\varepsilon = (p_{N-1}/p_0)^{(1/N)} - 1$.

4. The surface acoustic wave sensor of claim 3, wherein
   one of $p_0$ and $p_{N-1}$ is equal to $V/(2F_{max})$, and
   the other of $p_0$ and $p_{N-1}$ is equal to $V/(2F_{min})$.

5. The surface acoustic wave sensor of claim 1, wherein each of the plurality of reflective elements is a groove etched into the surface of the substrate.

6. The surface acoustic wave sensor of claim 5, wherein depths, normal to the surface of the substrate, of the plurality of reflective elements vary along the direction of acoustic wave propagation.

7. The surface acoustic wave sensor of claim 6, wherein the depths of the plurality of reflective elements are a linear function of distance from the first reflective element along the direction of acoustic wave propagation.

8. The surface acoustic wave sensor of claim 1, wherein each of the plurality of reflective elements is a ridge extending from the surface of the substrate.

9. The surface acoustic wave sensor of claim 8, wherein heights, normal to the surface of the substrate, of the plurality of reflective elements vary along the direction of acoustic wave propagation.

10. The surface acoustic wave sensor of claim 9, wherein the heights of the plurality of reflective elements are a linear function of distance from the first reflective element along the direction of acoustic wave propagation.

11. The surface acoustic wave sensor of claim 1, where the direction of acoustic propagation is parallel to a crystalline axis of the substrate.

12. The surface acoustic wave sensor of claim 11, wherein the substrate is 128-degree rotated Y-cut LiNbO3 and the direction of acoustic propagation is parallel to an X axis of the substrate.

13. The surface acoustic wave sensor of claim 11, wherein the substrate is Y-cut LiNbO3 and the direction of acoustic propagation is parallel to a Z axis of the substrate.

14. The surface acoustic wave sensor of claim 1, wherein widths, normal to the direction of acoustic wave propagation, of the plurality of reflective elements vary along the direction of acoustic wave propagation.

15. The surface acoustic wave sensor of claim 14, wherein the widths of the plurality of reflective elements are a linear function of distance from the first reflective element along the direction of acoustic wave propagation.

16. A passive sensor system, comprising:
    a surface acoustic wave sensor comprising:
       a piezoelectric substrate;
       an interdigital transducer (IDT) formed on a surface of the substrate;
       a first reflector formed on the surface of the substrate, the first reflector displaced from the IDT in a direction of acoustic wave propagation by a first distance; and
       a second reflector formed on the surface of the substrate, the second reflector displaced from the IDT in a direction of acoustic wave propagation by a second distance different from the first distance, wherein
       each of the first and second reflectors comprise respective first and second pluralities of elongate reflective elements, each plurality of reflective elements including a first reflective element and N additional reflective elements, where N is a positive integer,
       a long axis of each of the reflective elements is perpendicular to the direction of acoustic wave propagation, and
       for each of the first and second pluralities of reflective elements, a distance between adjacent reflective elements along the direction of acoustic wave propagation is a linear function of distance from the first reflective element along the direction of acoustic wave propagation.

17. The passive sensor system of claim 16, wherein
    the first reflector is disposed to reflect a first portion of an acoustic wave launched by the IDT as a first reflected wave,
    the second reflector is disposed to reflect a second portion of the acoustic wave launched by the IDT as a second reflected wave, and the first and second reflected waves return to the IDT separated in time by an offset time interval proportional to the difference between the first distance and the second distance.

18. The passive sensor system of claim 16, further comprising:
a reader configured to generate a radio frequency (RF) signal to interrogate the surface acoustic wave sensor, receive a reflected RF signal from the surface acoustic wave sensor, and process the reflected RF signal to determine a duration of the offset time interval.

19. The passive sensor system of claim 18, wherein the reader is further configured to map the determined duration to a physical parameter of the acoustic wave sensor and/or the environment of the acoustic wave sensor.

20. The passive sensor system of claim 19, wherein the physical parameter is a temperature of the surface acoustic wave sensor.

21. The passive sensor system of claim 19, wherein an additional sensitive layer is deposited between the first distance and the second distance, and the physical parameter is a measured changing physical property of said layer.

* * * * *